United States Patent [19]

Curtis et al.

[11] Patent Number: 5,198,965
[45] Date of Patent: Mar. 30, 1993

[54] FREE FORM PACKAGING OF SPECIFIC FUNCTIONS WITHIN A COMPUTER SYSTEM

[75] Inventors: Stephen A. Curtis, Austin, Tex.;
Ronald W. Gedney, Vestal, N.Y.;
Gustav Schrottke, Austin, Tex.

[73] Assignee: International Business Machines Corporation, Armonk, N.Y.

[21] Appl. No.: 809,992

[22] Filed: Dec. 18, 1991

[51] Int. Cl.⁵ .............................................. H05K 7/20
[52] U.S. Cl. .................................. 361/386; 361/398; 439/67; 439/77
[58] Field of Search ............... 357/81; 165/80.3, 185; 439/61, 67, 68, 74, 77; 361/383, 386–389, 395, 396, 398, 403, 410, 412, 413, 414; 174/254

[56] References Cited

U.S. PATENT DOCUMENTS

| | | | |
|---|---|---|---|
| 3,579,206 | 5/1971 | Grange | 340/173.1 |
| 3,718,842 | 2/1973 | Abbott, III | 350/334 |
| 3,766,439 | 10/1973 | Isaacson | 317/100 |
| 4,177,519 | 12/1979 | Kasabuchi et al. | 364/712 |
| 4,495,546 | 1/1985 | Nakamura et al. | 361/398 |
| 4,587,596 | 5/1986 | Bunnell | 361/398 |
| 4,598,337 | 7/1986 | Wuthrich et al. | 361/401 |
| 4,677,527 | 6/1986 | Pasterchik, Jr. et al. | 361/395 |
| 4,677,528 | 6/1987 | Miniet | 361/398 |
| 4,716,259 | 12/1987 | Tokura et al. | 174/68.5 |
| 4,744,008 | 5/1988 | Black et al. | 361/386 |
| 4,781,601 | 11/1988 | Kuhl et al. | 439/77 |
| 4,811,082 | 3/1989 | Jacobs et al. | 357/80 |
| 4,843,520 | 6/1989 | Nakatani et al. | 361/395 |
| 4,902,236 | 2/1990 | Hasircoglu | 439/77 |
| 4,914,551 | 4/1990 | Anschel | 361/386 |
| 4,928,206 | 5/1990 | Porter et al. | 361/385 |
| 4,933,810 | 6/1990 | Cardashian et al. | 361/398 |
| 4,937,707 | 6/1990 | McBride et al. | 361/396 |
| 4,939,534 | 7/1990 | Miyazaki | 341/22 |
| 4,990,948 | 2/1991 | Sasaki et al. | 354/485 |
| 4,996,585 | 2/1991 | Gruber et al. | 357/74 |
| 4,997,377 | 3/1991 | Goto et al. | 439/68 |
| 5,008,496 | 4/1991 | Schmidt et al. | 174/254 |
| 5,040,997 | 8/1991 | Garner | 439/77 |
| 5,050,039 | 9/1991 | Edfors | 361/388 |
| 5,053,922 | 10/1991 | Matta | 361/386 |
| 5,057,907 | 10/1991 | Ooi et al. | 357/80 |
| 5,058,053 | 10/1991 | Gillett | 364/900 |

FOREIGN PATENT DOCUMENTS 7606726 3/1976 France .
2201993 8/1990 Japan .

OTHER PUBLICATIONS

IBM TDB "Low-Cost, High-Power Multi-Chip Module Design", vol. 31, No. 3, Aug. 1988, pp. 451–452.
IBM TDB "High Density Flexible Connector", vol. 32, No. 7, Dec. 1989, pp. 344–345.
IBM TDB "Concept for Forming Multilayer Structures for Electronic Packaging", vol. 30, Aug. 1987, pp. 1353–1356.
IBM TDB "Multilayer Flexible Film Module", vol. 26, No. 12, May 1984, p. 6637.
IBM TDB "Flexible Connector for Card-On-Board Top of Card Applications", vol. 22, No. 9, Feb. 1980, pp. 3996–3997.

*Primary Examiner*—Gerald P. Tolin
*Attorney, Agent, or Firm*—Mark E. McBurney

[57] ABSTRACT

A method and apparatus is provided for allowing computer functions formed on a flexible substrate to be adjacently stacked in layered relation. Each functional island will have an electrical connector on one end thereof. The electrical connector may include a plurality of conductive pads formed over solid vias that form a surface for electrically interconnecting adjacent flexible carriers of the functional islands. The solid vias and connection pads are also used to provide electrical communication between the reference plane, signal lines and chips that make up the functional islands, and chips contained on other functional islands, or on the planar. The plural functional islands are removably affixed to the planar by reflowing joining metallurgy on the connection pads of adjacent layers, or by using a compression type connector. The remaining portions of the functional islands are then flexibly placed within the computer system with varying amounts of space between the layers.

11 Claims, 7 Drawing Sheets

FREE FORM PACKAGING OF SPECIFIC FUNCTIONS WITHIN A COMPUTER SYSTEM

BACKGROUND OF THE INVENTION

1. Field of the Invention

This invention generally relates to the packaging and placement of electronic components within a computer system. More specifically, the present invention relates to a method of packaging flexible computer functional islands, which consist of particular integrated circuit devices, in order to provide increased performance and decrease computer size.

2. Description of Related Art

Conventionally, integrated circuit devices (ICs or chips) that constitute specific functions in a computer system, such as memory, graphics adapters, processors, device drivers (keyboard, display, mouse drivers and the like) are mounted and electrically connected to rigid printed circuit cards. These functions are either wired onto circuit cards that are in turn electrically interconnected with the computer planar, or motherboard, or are packaged on the motherboard itself to provide the functions required by the particular computer. It can be seen from FIG. 1 that rigid circuit cards 2 connected to a planar 3, by way of connectors 4, require a large amount of planar space. Additionally, if the functions packaged on these cards are wired onto the planar, the size of the planar correspondingly increases.

In order to decrease the size of computers, and to increase flexibility and performance, flexible cable has been used to interconnect particular printed circuit cards. It is currently known to provide entire computer functions on a single flexible carrier, by attaching a chip or set of chips thereto. For example, U.S. Pat. Nos. 4,177,519 and 4,081,898 describe using a flexible carrier with electronic components thereon to manufacture hand held calculators. Further, the manufacture of wrist watches using functional areas is shown by U.S. Pat. Nos. 4,598,337 and 4,064,552. A camera lens including a flexible printed circuit board with chips thereon is described by U.S. Pat. No. 4,990,948. U.S. Pat. No. 4,843,520 shows an electronic circuit module with electronic components attached to a flexible film that is attached to first and second substrates. U.S. Pat. No. 4,104,728 describes an electronic apparatus with a flexible substrate, having a wiring pattern formed thereon which is disposed in a housing. Additionally, U.S. Pat. No. 5,050,039 describes interconnecting plural interconnect boards having chips thereon by using a discrete flex circuit. U.S. Pat. No. 4,997,377 is an adaptor for computers wherein a flexible carrier with a connector on one end is plugged into a microprocessor socket. The microprocessor and additional memory chips are disposed on the other end of the flex carrier, thereby allowing additional memory to be included in the computer system. Furthermore, U.S. patent application "Formulation of Multichip Modules," filed Oct. 28, 1991, having serial no. 07/783,644 and assigned to the assignee of the present invention, hereby incorporated by reference, discloses a method of forming complex areas of computer functions on a flexible substrate.

However, in these prior art systems only single functional islands are attached to the circuit card or planar, or other I/0 connection point. Thus, using conventional computer packaging technology, the different computer functions are provided on either a circuit card, or a single flexible carrier, which is in turn attached to a planar, or motherboard.

Generally, a computer is designed to contain a number of functions (e.g. graphics, memory, device drivers, and the like) and the size of the computer is balanced against the number and capability of the functions included therein.

Therefore, it would be desirable to be able to create a higher performance, smaller and less complex computer by combining a plurality of functional islands, such as graphics or memory islands that are interconnectable and compatible with one another. Additionally, it would be advantageous to have specific types of functional islands that would be interchangeable with one another. For example, low performance and high performance graphics functional islands could be made interchangeable to alter the capabilities of the computer system, depending upon user needs and desires. These functional islands can then be packaged and formed within the computer to drastically reduce the size of the planar and correspondingly decrease the size of the computer product. Additionally, performance of the computer will be improved due to the shorter signal line distances resulting from the compactness of the design.

SUMMARY OF THE INVENTION

In contrast to the prior art, the present invention is a free form packaging method and apparatus wherein flexible functional islands can be disposed adjacently and stacked to electrically interconnect with one another. These functional islands include entire computer functions and in general are multichip modules (MCM) packaged on flexible substrate carriers designed to reduce input/outputs (I/Os) and hence connector complexity. Also the functional islands are designed to have a common electrical interconnection interface to allow interchangeability.

More particularly, the present invention provides a unique method and apparatus for allowing the previously discussed functional islands to be layered. e.g. stacked adjacently. The functional islands are formed on flexible substrates having electrical connection means on one end thereof. The electrical connector may include a plurality of conductive pads formed over solid vias that form a surface for electrically interconnecting adjacent flexible carriers. The solid vias and connection pads are also used to provide electrical communication between the reference plane, signal lines and chips that make up the functional islands, as well as chips contained on other functional islands, or on the planar.

In operation, the functional islands are disposed directly adjacent and stacked with one another at the end having the electrical connector, which is attached to a planar, or other connection point. The plural functional islands are removably affixed to the planar by reflowing joining metallurgy on the connection pads of adjacent layers, or by using a commercially available compression type connector. The remaining portions of the functional islands are then flexibly disposed in adjacent layers with varying amounts of space between the layers. In this manner the adjacent flexible layers can be parallely stacked, or "fanned out," wherein each layer is disposed at a different angle with respect to the planar.

Therefore, in accordance with the previous summary, objects, features and advantages of the present invention will become apparent to one skilled in the art from the subsequent description and the appended claims taken in conjunction with the accompanying drawings.

DETAILED DESCRIPTION OF THE PREFERRED EMBODIMENTS

Figure 1:
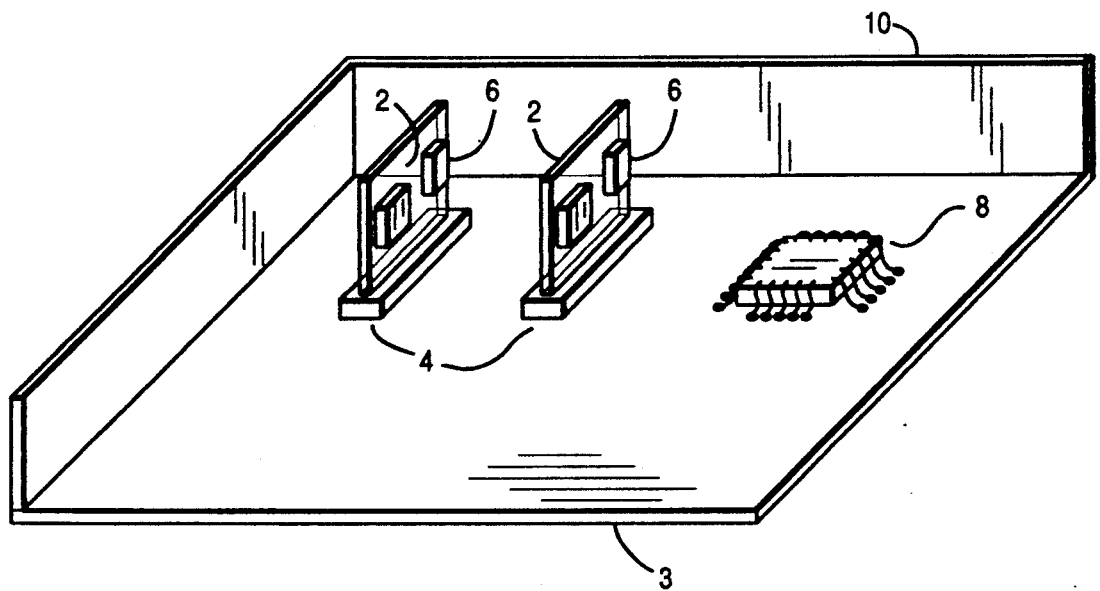
FIG. 1 is a perspective view of a prior art planar with two conventional rigid circuit cards interconnected thereto.
Figure 2:
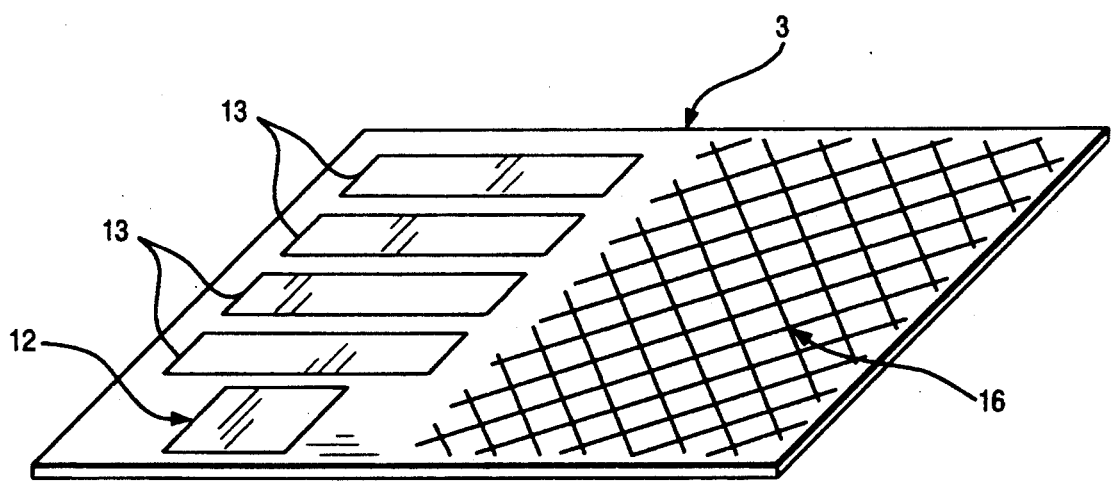
FIG. 2 is a conventional planar with a schematic configuration of a memory subsystem that represents the amount of planar space that can be saved by use of the present invention.

Referring to FIG. 1, a prior art configuration of a computer planar 3, or motherboard, is shown having two circuit cards 2 attached thereto. Planar 3 and circuits cards 2 each include internal electrical conductor layers such that chips 6 on circuit cards 2 are electrically interconnected to a processor 8 on planar 3. Connectors 4 are used to make the electrical connection between circuit cards 2 and planar 3. A portion of the computer housing is shown as edge 10 which is perpendicular to planar 3 and substantially adjacent thereto. FIG. 2 shows a prior art planar which includes a memory configuration thereon. A memory controller 12, and memory modules 13 which may contain a plurality of memory chips such as the dynamic random access memory (DRAM) chips manufactured by the IBM Corporation. It is understood that these modules may be conventionally packaged on other rigid circuit cards such as single in-line memory modules (SIMMs). common in the industry and electrically attached to the planar using various types of connectors, also common in the industry. It can be seen that a large amount of the planar 3 surface area must be utilized in order to accommodate the controller 12 and memory modules 13. Further, only a portion 16 of planar 3 can be utilized for functions other than memory, such as the inclusion of a central processing unit 8 or other connector and circuit card assemblies as shown in FIG. 1. Thus, it can be seen that a technique for relocating the memory function separately from planar 3 would make previously unavailable planar space free to be used for other purposes, or to reduce the size of the planar and hence the computer.

Figure 3:
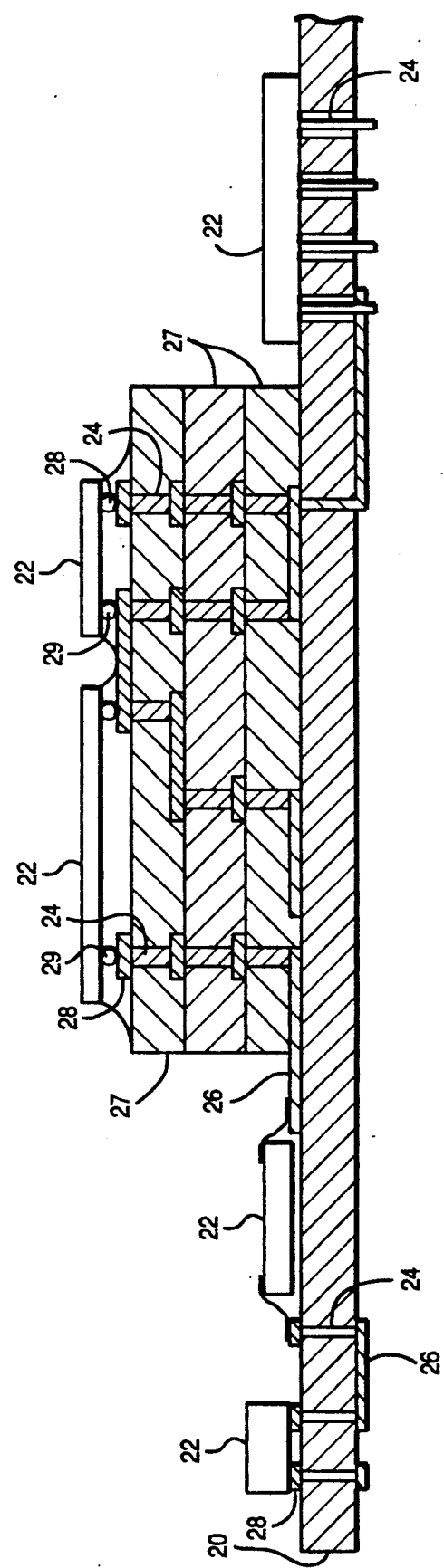
FIG. 3 is crossectional view of a multilayered functional island affixed to a flexible carrier.

FIG. 3 is a functional island consisting of a plurality of integrated circuit devices interconnected and packaged in a manner described in the previously noted patent application having Ser. No. 07/783,644. Briefly, a flexible substrate 20 is shown and includes vias 24 which interconnect circuitized lines 26 on each side thereof. Dielectric layers 27 are sequentially placed on carrier 20, using lamination techniques, or the like and include vias 24 therein which interconnect connection pads 28 and circuitized lines 26. Chips 22 are then attached to the top dielectric layer 27 using solder balls 29 and connection pads 28. FIG. 3 shows a representative computer functional island 18 which can be utilized by the present invention. It should be understood that the function packaged, as shown in FIG. 3, may include computer functions as complex as a central processing unit.

Figure 4:
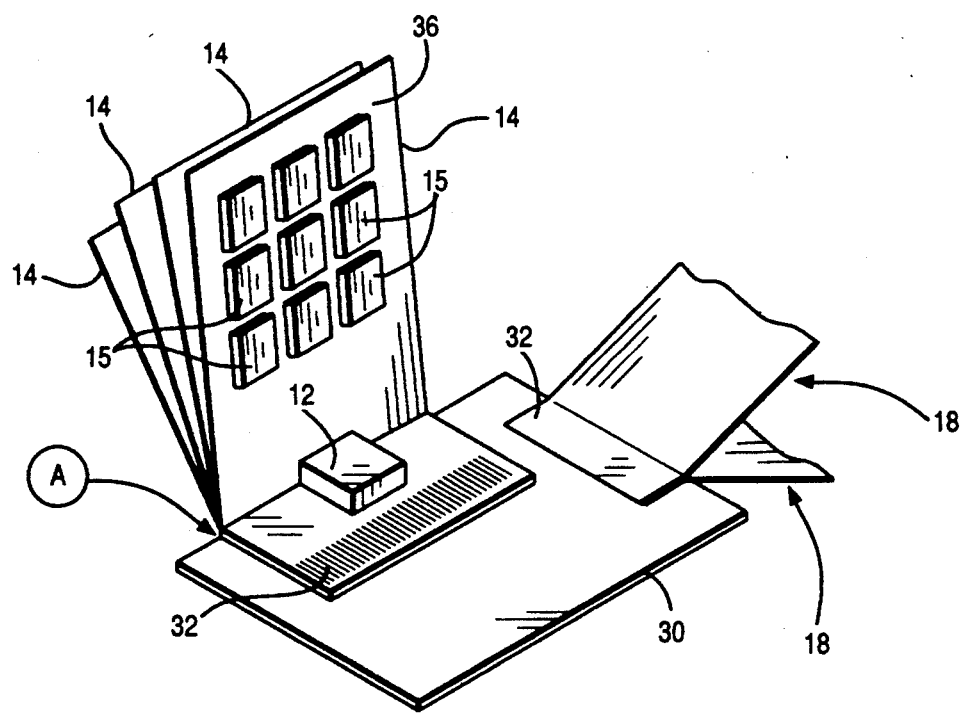
FIG. 4 is an embodiment of the present invention wherein multiple, flexible functional islands are adjacently stacked and electrically interconnected to one another and connected to a single planar.

FIG. 4 shows a preferred embodiment of the present invention wherein a greatly reduced size planar 30 is shown having the memory function of the computer attached thereto. Additionally, other computer functional islands 18 are attached to the reduced size planar 30. It can be seen from FIG. 4, that memory controller 12 (FIG. 2) is placed on the top most layer of a plurality of adjacently stacked memory functional islands 14. These islands 14 are essentially individual computer functions such as shown in FIG. 3 wherein providing the memory requirement for the computer is the function being performed. Memory chips 15 are electrically interconnected and mechanically placed on modules 14 which include a flexible substrate material 36. Memory controller 12 is placed on planar 30 and interconnected thereto via electrical connection means 32. Of course, each of modules 14 includes memory chips 15 thereon which are interconnected through their respective substrate 36 with memory controller 12. Further, it can be seen that various numbers of modules 14 can be utilized such that the optimum memory capacity for the computer being manufactured is provided. Electrical connection means 32 are also capable of interconnecting functional islands 18 with planar 30 in a manner similar to the electrical connection of islands 14. It should be noted that electrical connection means 32 may vary in configuration in order to be compatible with the type of function provided on module 14 or functional island 18. Of course, modules 14 are in fact functional islands wherein memory is the computer function being provided. The remaining circuitry on the planar 30 may only include that circuitry required for the central processor function and related support components, such that planar 30 can also be considered a functional island. In this case, the other computer functions will have been placed on additional functional islands 18.

Figure 5:
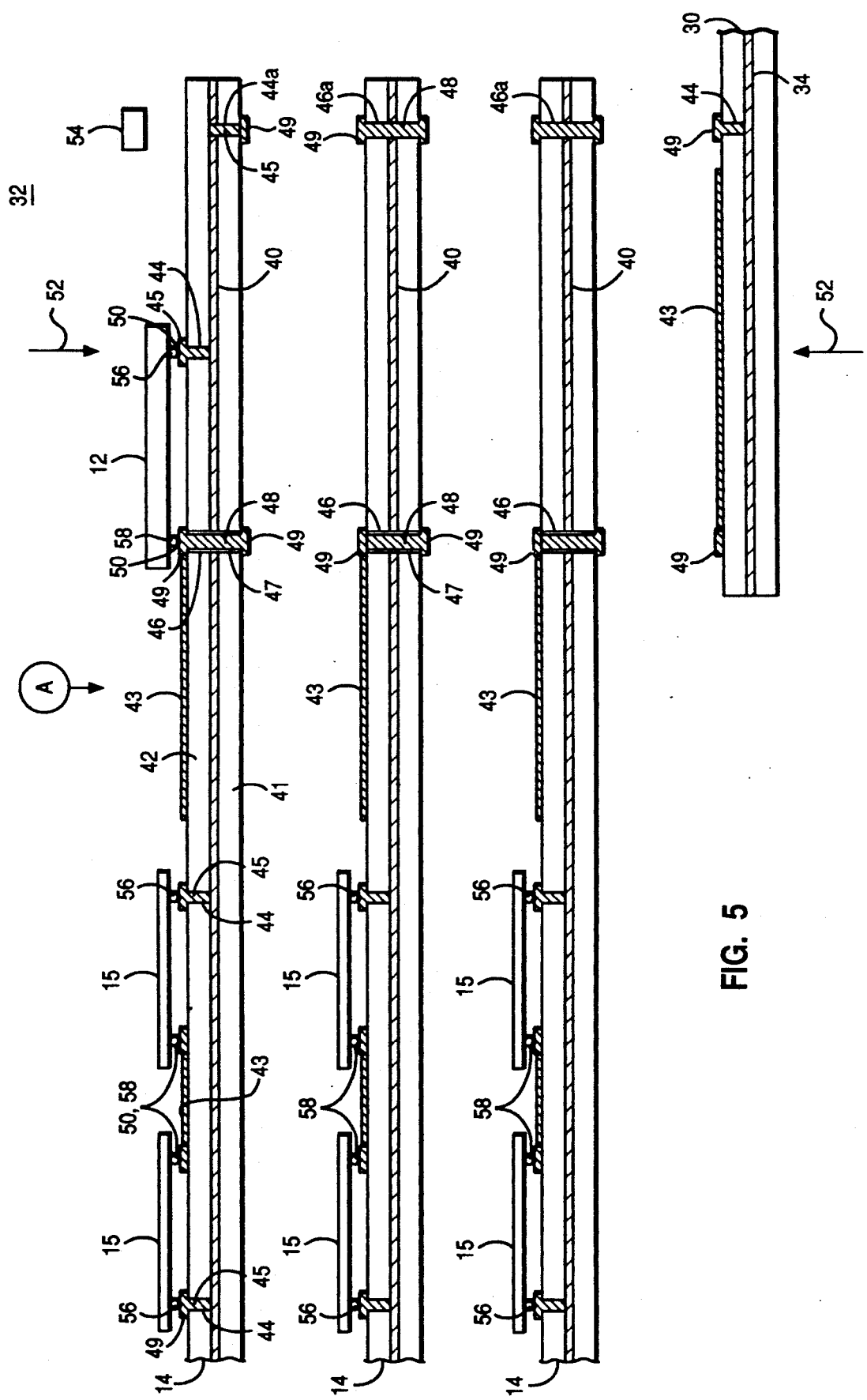
FIG. 5 is an exploded crossectional view of the stacked flexible functional islands of FIG. 4 and shows the electrical connections between the layers and the planar.

Referring to FIG. 5 an exploded view of plural functional islands and an embodiment for interconnecting the functional islands with one another and planar 30 is shown. In particular, a plurality of memory functional islands 14 are shown in an exploded fashion such that the interconnection therebetween can be described. It should be noted that FIG. 5 will be described in terms of a memory functional island, but it should be noted that any other type of computer function could be utilized with the only requirement being that it is attached to a flexible substrate such as shown in FIG. 3. The functional island 14 may simply consist of a one signal one reference plane (1S1P) substrate wherein the reference plane 40 may be made of copper-invar-copper (CIC) or other suitable electrically conducting material. Of course, substrates more complex than ISIP are contemplated by the present invention. CIC not only provides an electrically conductive layer, but also is used to provide thermal expansion control such that the expansion of the silicon chips and their respective functional island is matched. Dielectric layers 41 and 42 are then placed on each side of reference plane 40 to electrically insulate the reference plane 40 from circuitized layer 43, to be added later. Vias 44, 44a, 46 and 46a are then formed in flexible substrate 14 by methods known in the art, such as drilling, laser ablation, or the like. It should be noted that vias 46, may be formed in reference plane 40 prior to the placement of dielectric layers 41 and 42 thereon such that the dielectric material of layers 41 and 42 is the only material that must be removed in order to form vias 44 and 46. It should be noted that vias 44 and 44a are "blind vias" which merely expose reference plane 40 through one of the dielectric layers 41 or 42. Essentially, a "blind via" allows for electrical connections to the reference plane, but does not electrically connect opposite sides of functional island 14. However, via 46 extends completely through flexible functional island 14 and is utilized to pass electrical signals through the entire width of flexible functional island 14. Of course, downwardly facing blind vias, 44a in conjunction with vias 44 will allow transmission of electrical signals between I/Os 56 of chip 12 and the reference plane 40 of flexible functional island 14.

Subsequent to formation of vias 44 and 46, an electrically insulating material is placed within vias 46 by method such as squeezing or the like, followed by a drilling operation to maintain the insulated material around the annulus of originally formed via 46. Electrically conductive material 45, such as copper, or the like is then placed into vias 44 by means such as electroplating electrodeposition, or the like. Conductive material 48 is then placed in via 46 inside dielectric annular layer 47 by using conventional techniques such as plating, or the like.

Circuitized electrical transmission lines 43 are then formed on the surface of dielectric layer 42 of flexible functional island 14. Circuitized lines 43 are formed by any one of a number of conventional methods including utilizing a polymer thick film (PTF) coating which is screened on and exposed to actinic radiation through a photomask. The PTF having the desired pattern is cured by the radiation and the unwanted (uncured) polymer thick film material is removed to leave the desired configuration of circuit lines. Other methods include sputtering a thin seed layer of electrical conductor on the surface of dielectric layer 42 and then electroplating or electrodepositing additional electrically conductive material in the desired thickness and pattern of transmission lines 43 thereon. Subsequent to placement of circuitized lines 43, electrical connection pads 49 are formed on the appropriate sides of dielectric layers 41 and 42 and adjacent with vias 46, 44 and 44a. Connection pads 49 can be plated onto the exposed end of conductive material 45 and 48 within vias 46, 44 and 44a, as is well known in the art. It should be noted that connection pads 49 will consist of various types of material depending on whether an electronic circuit device is to be attached thereto, or if connection pads 49 are to be used to interconnect adjacent functional computer islands 14. Integrated circuit devices 15 are then removably attached to the connection pad 49 using controlled collapse chip connect (C4) technology or the like. Using C4 attachment methods, solder balls 50, previously placed on chips 15 during their fabrication, are aligned with connection pads 49. Solder balls 50 are then reflowed to electrically and mechanically attach chips 15 to the flexible computer functional island 14. If the type of materials chosen for the functional island is such that the chips may only be attached using lower temperature solder, then the C4 type chips can be attached by reflowing solder previously deposited on the connection pads by any of several known techniques, such as plating or screening. Additionally, a conductive epoxy material can also be used to attach the chips 15 to connection pads 49. Additionally, memory controller chip 12 may be attached to the upper functional island 14 also using C4 techniques, or the like. US patent application entitled "Inverted Bump Chip Connect," having serial No. 07/771,695, assigned to the assignee of the present invention, filed on Oct. 4, 1991, and hereby incorporated by reference describes various techniques for attaching chips with differently configured I/Os and interconnection materials to a single circuit board.

Thus, when plural functional islands 14 are adjacently stacked and joined in the direction shown by arrows 52 it can be seen that functional islands 14 are each in electrical communication with one another and with planar 30. For example, it can be seen that input/output interconnection point 56 of chip 12 is in electrical communication with reference plane 40 and the I/Os 56 of chips 15. Electrical connection of all ground planes 40 and reference plane 34 of planar 30 is achieved through vias 44a and 46a. Additionally, I/Os 56 of chips 15 on the intermediate and bottom functional islands 14 are also interconnected with all other references plane 40 and I/Os 56 of the memory chip controller 12 and chips 15 on the other functional islands 14. Similarly, I/Os 58 of chip 12 are electrically connected to I/Os 58 of chips 15 on the upper functional island through circuitized lines 43 on the surface of dielectric layer 42. Further, I/Os 58 of chips 15 on the intermediate and lower functional islands 14 are interconnected with one another via circuitized lines 43 which interconnect with pads 49. Upon placement of adjacent functional islands 14, it can be seen that electrical signals can be transmitted between I/Os 58 of chips 12 and 15 of all the functional islands 14 through circuited lines 43, connection pads 49 and vias 46. Ultimately, chips 12 and 15 are capable of communicating with integrated circuit devices on planar 30 (not shown) through circuitized layer 43 on the surface of planar 30. Thus, it can be seen how plural functional islands 14 can be vertically registered and adjacently placed in layered relation in order to more densely dispose integrated circuit devices within a computer system. It should be noted that upon alignment of plural functional islands 14, joining metallurgy material of connection pads 49 may be reflowed thereby electrically and mechanically joining functional islands 14 with planar 30. Additionally mechanical connection means 54 could be used such as a compression type mechanical connector to maintain electrical and mechanical connection between functional islands. 14 and planar 30.

Reference A, as illustrated by the arrow in FIG. 5 is representative of a point on functional islands 14 which may be folded, or bent to a radius commensurate with the materials used, in order to form the "fan-out" configuration shown in FIG. 4. It can be seen that numerous configurations of flexible islands 14 are possible in a computer system using the present invention. Of course, functional islands 14 may be of various lengths and thickness in order to accommodate the specific placement desired in the computer system. For example, In order to use the "fan-out" configuration of FIG. 4 a relatively short and less resilient functional island will be utilized. In this manner the functional islands 14 are essentially self supporting with one end being required to be affixed to planar 30 for the necessary mechanical strength.

Figure 6:
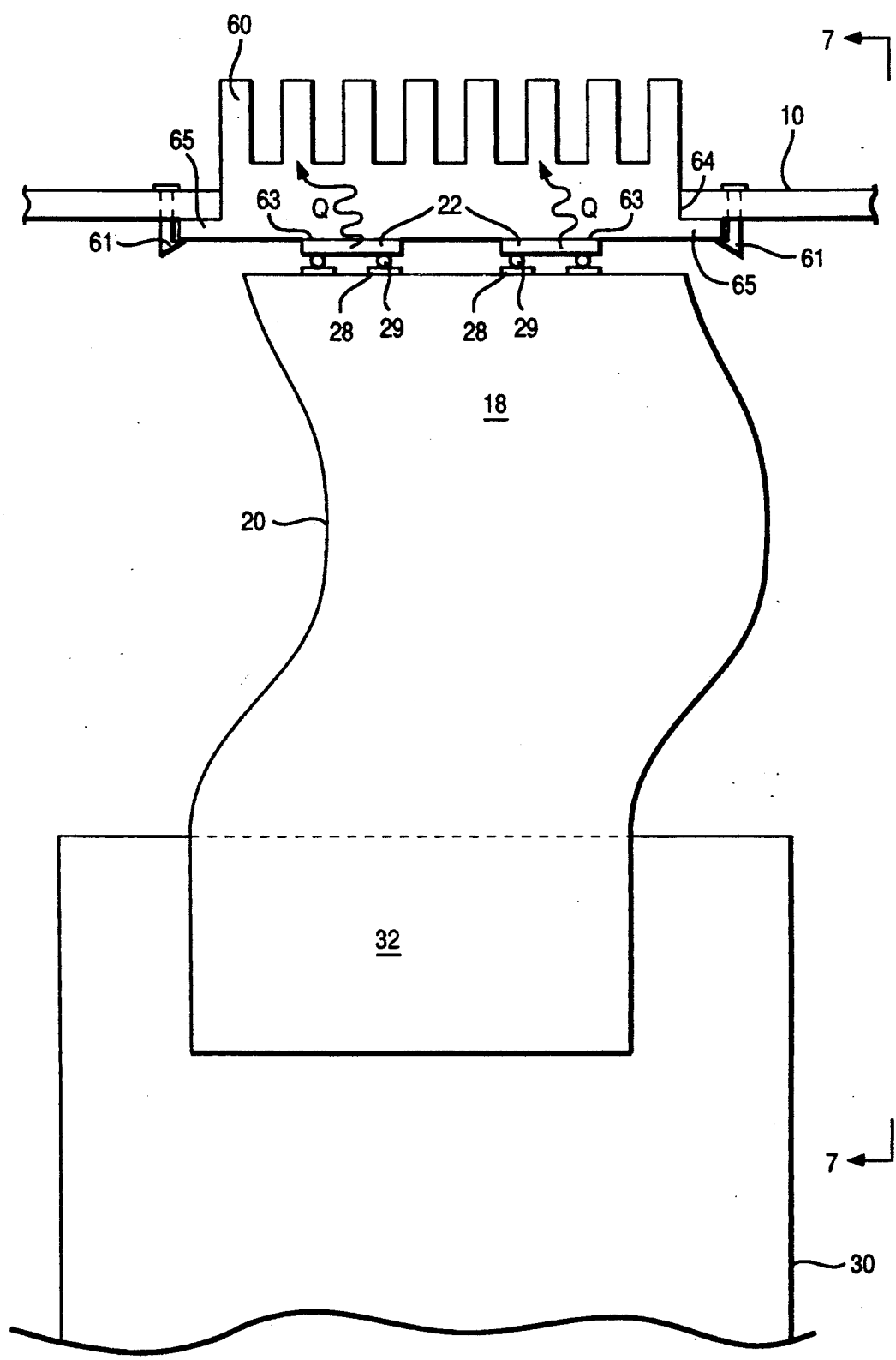
FIG. 6 is a plan view of the top one of multiple layered functional islands showing the attachment within the computer housing.

FIG. 6 is a plan view of another embodiment of the present invention. FIG. 6 is a plan view of an attachment configuration of a functional island within a computer system. A flexible substrate 20 of a functional island 18, such as shown in FIG. 3 is electrically and mechanically affixed to planar 30 by connection means 32, such as shown in FIG. 5 and previously described in conjunction therewith. Chips 22 are affixed to flexible substrate 20 via solder balls 29 and connection pads 28 in a manner similar to the configuration of FIG. 3. Computer cover 10 is shown having a hole 64 formed therein which is of a size corresponding to a heat sink 60, shown disposed therein. Protruding end portion 65 of heat sink 60 abuts the inside surface of cover 10 and allows holding clamps 61 to maintain heat sink 60 within hole 64 of cover 10. In a preferred embodiment, thermally conductive epoxy material such as is commercially available, is used to affix chips 22 onto the inside surface of heat sink 60 thereby providing a thermally conductive path from chips 22 to the ambient environment outside computer system cover 10. It can be seen that heat sink 60 may be matched in color and shape to the decor of the computer cover. The thermal emissivity and surface area of heat sink 60 will be chosen to maximize the radiation of generated heat from chips 22 through the cover 10 so that the junction temperature of chips 22 will be maintained at a satisfactorily low level.

Figure 7:
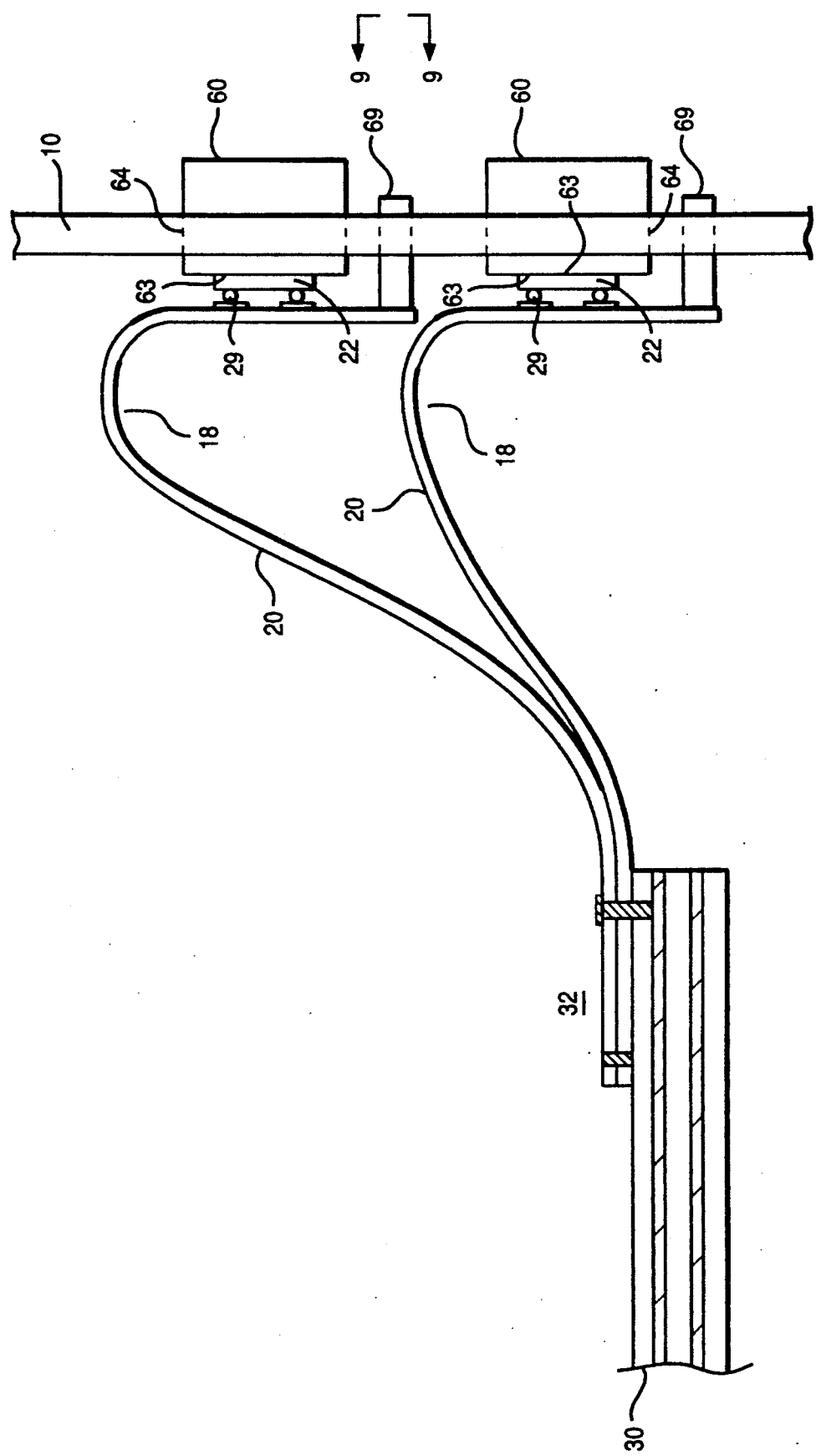
FIG. 7 is a side elevation taken along line 7—7 of FIG. 6 that illustrates the layered functional islands.

FIG. 7 is an elevation view taken along line 7—7 of FIG. 6. It can be seen that two flexible substrates 20 of the functional island 18 such as shown in FIG. 3 are disposed adjacent and vertically aligned in layered relation with one another. Computer cover 10 is shown having two holes 64 therein to accommodate two heat sinks 60 for the chips 22 disposed on the plural function islands 18. Again, a heat conducting epoxy material 63 is used to affix chips 22 to heat sink 60.

Figure 9:
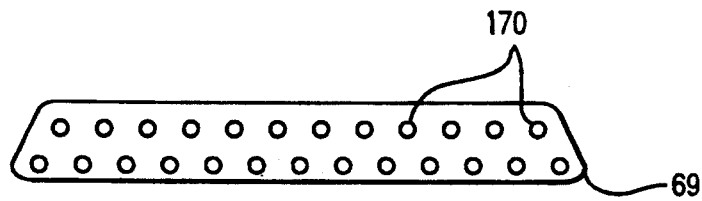
FIG. 9 is a view taken along line 9—9 of FIG. 7 of a representative connector that can be interconnected with the functional island of the present invention.

A connector 69 is also shown disposed with cover 10. Connector 69 may be a parallel port used to interconnect peripheral devices such as a printer, display, external: DASD, or the like to the computer system. FIG. 9 is a front view of a connector 69 such as may be used by the present invention shown in FIG. 7. A parallel type connector having 25 pins 170 is shown in FIG. 9 and is illustrative of the type contemplated by the present invention. Of course the present invention is not limited to the specific connector shown in FIG. 9 and contemplates any other connector compatible with the computer function packaged on island 18. It will be understood that connector 69 can be attached, both electrically and mechanically to flexible substrate 20, by methods such as described in the previously noted U.S. patent applications having Ser. Nos. 07/771,695 and 07/783,644, and becomes a component of functional island 18. Further, it can be seen that by placing the computer function, i.e. chips 22, close to connecter 69 the distance from the chips 22 to the peripheral device being controlled is minimized. For example, if functional island 18 is a graphics adapter, then the performance of the computer will be increased if the high performance chips are closer to the connector corresponding to the display which they control. In this manner, the signal transmission lines within the flex carrier 20 of functional island 18 will be much shorter than if the graphics function was on a rigid circuit card connected to a motherboard (or on the motherboard itself). as shown in FIG. 1.

Flexible substrates 20 and electrical connection means 32 are then used to electrically interconnect chips 22 of the functional islands 18 with one another and with other electronic devices connected with planar 30. Again, electrical connection means 32 such as described with reference to FIG. 5 are used to make the interconnection between the functional islands 18 and planar 30.

Figure 8:
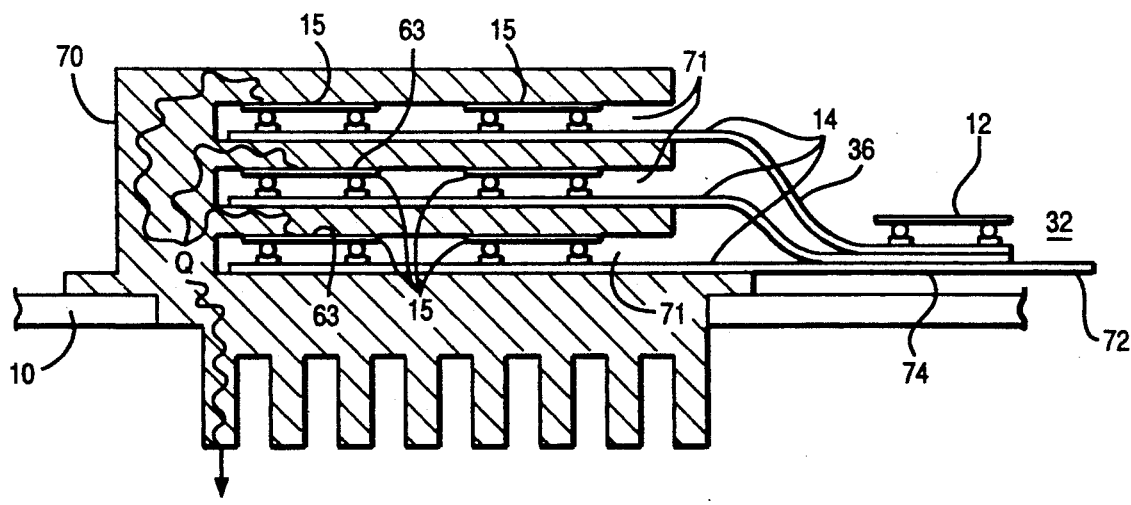
FIG. 8 is another embodiment of the present invention wherein plural flexible layers are placed intermediate a heat sink to enhance thermal efficiency.

FIG. 8 is another embodiment of the present invention wherein plural memory functional islands 14 are disposed within a receiving area, or cavity 71 of heat sink 70. The electrical and mechanical connections of chips 12 and 15 to functional islands 14 of is accomplished using electrical connection means 32 identical to the configuration shown in FIG. 5 and discussed therewith. Again, a thermally conductive epoxy can be used to bond chips 15 to heat sink 70 such that the chips will be maintained within cavity 71 and the generated heat can be conducted through heat sink 70 to the ambient environment outside of cover 10. Additionally, it can be seen that it may be desirable bond the underside 74 of the lowest functional island 14 to the inside of cover 10 by use of an epoxy material or the like. However the length and resilience of functional islands 14 may allow the areas joined by electrical means 32 to essentially be free standing within the computer system. Additionally, one of the flexible substrates 36 of a functional island 14 must be extended as shown by reference numeral 72 for attachment to the planar 30 (not shown) disposed in the computer system. Using the embodiment of FIG. 8, it can be seen that a plurality of adjacently stacked functional islands can be placed within the computer system at a location that is independent of the placement of the planar 30 within the computer thus greatly reducing the size of the planar required in the computer system.

Figure 10:
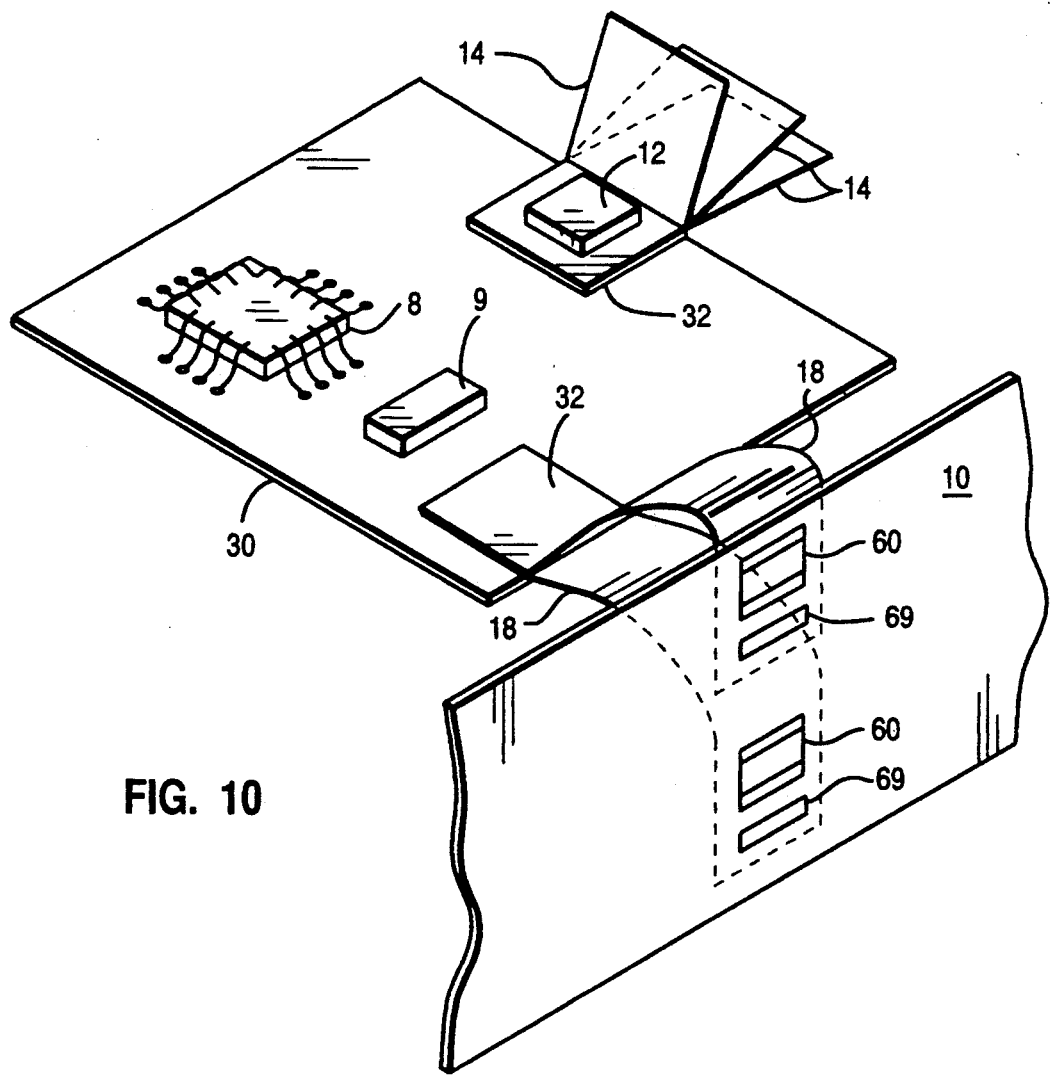
FIG. 10 is a perspective view of the present invention wherein multiple functional islands are interconnected to a reduced size planar to form a computer system.

FIG. 10 is a perspective view of the present invention showing the reduced planar 30 having plural functional islands 18 and 14 attached thereto. Planar 30 includes processor 8 and chip 9 affixed directly thereon by various techniques such as C$ attachment, wire bonding, conductive epoxy bonding, surface mount techniques, or the like. It is understood that the processor functions contains heat producing components that require thermal enhancement to adequately lower junction temperatures. The thermal dissipation means for the processor 8 is not shown, but are similar to those discussed above with regard to FIGS. 6–8 except that the heat sink would be mounted in the computer cover. The memory function is then shown including plural modules 14 having chips 15 (not shown) and a controller all electrically interconnected using connection means 32 with planar 30 in the manner of FIG. 5. Two functional islands 18 are also shown and attached to planar 30 also by using the electrical connection means 32 of FIG. 5, or a similar configuration. Flexible substrate 20 is formed within the computer system and placed adjacent cover 10, in a manner as shown in FIG. 7. The chips of functional island 18 are attached to heat sink 60 using thermally conductive epoxy or other means, such as a compression fitting, a strap, or the like such that intimate contact will be maintained between the chips and heat sink. Connectors 69 are also shown and used to attach the chips and other electrical components of functional island 18 with the corresponding peripheral device.

Therefore, by comparing FIGS. 1 and 10, it can be seen that a smaller and less complex computer can be fabricated using a combination of flexible functional island that are interconnectable and compatible with one another. Additionally, performance of the computer system can be increased due to reduced distances of transmission lines within the planar and reductions in the distance of lines required to connect related computer functions. Furthermore, by using by using available functional islands, a computer with desired characteristics can be built in free-form, since the islands can be placed on the most advantageous location in the computer while interfacing with the other islands. Improved versions of the functions may be used to upgrade an existing computer, or used in a totally new product which can be designed with minimum development time.

Although certain preferred embodiments have been shown and described, it should be understood that many changes and modifications may be made therein without departing from the scope of the appended claims.

What is claimed is:

1. A computer system including a computer and having a circuit board, comprising:
   a plurality of functional islands each including a flexible substrate carrier having integrated circuit devices mounted thereon, a reference plane making connections between said integrated circuit devices and circuitized lines transmitting electrical signals between said integrated circuit devices; and
   means electrically interconnecting said functional islands to said computer circuit board such that said functional islands are adjacently stacked in layered relation and in physical contact with one another, including a plurality of vias within each said flexible substrate for electrically exposing said circuitized lines and said reference planes and a plurality of connection pads, disposed on said vias, for interconnecting the circuitized lines and the reference planes of respective ones of said adjacently stacked functional islands.

2. A system according to claim 1 wherein said electrical interconnection means are disposed at one end of said functional islands.

3. A system according to claim 2 wherein said ends of said functional islands opposite said electrically interconnection means are unattached.

4. A system according to claim 2 wherein said computer system further comprises at least one heat sink disposed in a cover of said computer.

5. A system according to claim 4 wherein said at least one integrated circuit device of at least one of said functional islands is affixed to said heat sink.

6. A system according to claim 5 wherein said integrated circuit device is disposed within a cavity in said heat sink.

7. A system according to claim 6 wherein said integrated circuit device is affixed to said heat sink using thermally conductive epoxy.

8. A system according to claim 5 wherein each said functional island includes a connector capable of electrically attaching a peripheral device to said computer system.

9. A system according to claim 8 wherein each said connector is disposed in the cover of said computer system.

10. A system according to claim 1 wherein said adjacently stacked functional islands are electrically interconnected by solder disposed on said connection pads.

11. A system according to claim 1 wherein said adjacently stacked functional islands are electrically interconnected by a connector that compresses adjacent ones of said connection pads to one another.

* * * * *